United States Patent [19]

Bolon et al.

[11] 3,989,644
[45] Nov. 2, 1976

[54] RADIATION CURABLE INKS

[75] Inventors: Donald A. Bolon, Scotia; Gary M. Lucas, Schenectady, both of N.Y.; Mary S. Jaffe, Cleveland Heights, Ohio

[73] Assignee: General Electric Company, Schenectady, N.Y.

[22] Filed: Sept. 27, 1974

[21] Appl. No.: 509,823

[52] U.S. Cl. .......................... 252/514; 252/501; 252/512; 252/513; 106/31; 260/37 M; 260/28 R; 260/42.22; 204/159.11; 204/159.15; 204/159.16; 204/159.18
[51] Int. Cl.² .................................. H01B 1/02
[58] Field of Search .......... 252/501, 511, 512, 514; 106/31; 260/28, 37 M, 42.22; 204/159.15, 159.16, 159.18, 159.11

[56] References Cited
UNITED STATES PATENTS

| | | | |
|---|---|---|---|
| 2,795,680 | 6/1957 | Peck | 252/511 X |
| 3,412,043 | 11/1968 | Gilliland | 252/514 |
| 3,414,417 | 12/1968 | Miller et al. | 106/31 X |
| 3,661,614 | 5/1972 | Bassemir et al. | 260/86.1 E X |
| 3,746,662 | 7/1973 | Adelman | 252/514 X |
| 3,835,085 | 9/1974 | Wrzesinski | 260/28 X |
| 3,875,094 | 4/1975 | Schroeter | 260/28 |

FOREIGN PATENTS OR APPLICATIONS

| | | | |
|---|---|---|---|
| 33-4,985 | 7/1958 | Japan | 252/511 |

Primary Examiner—Benjamin R. Padgett
Assistant Examiner—E. Suzanne Parr
Attorney, Agent, or Firm—William A. Teoli; Joseph T. Cohen; Jerome C. Squillaro

[57] ABSTRACT

A radiation curable ink is provided which is convertible to a conductive coating when cured on the surface of a substrate. A non-ionic surfactant is used in the curable ink in combination with a particulated metal containing conductive filler and an organic resin binder. As a result of using the non-ionic surfactant there was achieved a reduction in the tendency of the curable ink to form two distinct layers based on the separation of the conductive filler from the organic resin binder.

10 Claims, No Drawings

RADIATION CURABLE INKS

Prior to the present invention, various curable inks were available consisting of conductive particles or flakes in a matrix or binder in the form of an organic resin or a mixture of an organic resin and volatile solvent. These curable inks are used to make conductive coatings for circuit boards and ground coatings on electrical equipment, among other things. Unlike the complex etching method for making circuit boards requiring a high degree of resolution from copper clad laminates in which a negative photoresist is used in combination with a mask, the direct employment of the curable conductive ink is often more convenient and economical in particular applications.

One form of a curable ink used to make conductive coatings consist of a metal powder or flake in combination with an organic binder and an organic solvent. Cure of the ink is achieved upon evaporation of the organic solvent. Although curable inks based on solvent evaporation can be rendered conductive without heating, such inks are nevertheless unsuitable on a variety of plastic substrates. In addition, a significant amount of air pollution is created. Another available curable ink becomes conductive upon firing at an elevated temperature. It is based on the use of a conductive powder in combination with a glass as shown, for example, by J. E. Jolley, *Solid State Technology*, May, 1974, pp. 33–37. In order to render the ink conductive, it is necessary to fire the ink at temperatures up to 900° C. As a result, the conductive ink can only be employed on ceramic substrates which are able to withstand such extreme temperature conditions.

As shown by Ehrreich et al U.S. Pat. No. 3,202,488 and Gillard U.S. Pat. No. 3,412,043, additional conductive inks are available based on the employment of an epoxy resin which can be employed in the form of either a one-package or two-package system. A low temperature cure can be achieved with the two-package system requiring a mixing of the curing catalyst immediately prior to use, but the applied ink remains tacky for several hours. Conversely, the relatively short pot-life of the resin restricts its use to uneconomic batch type operations. Although the one-package system allows for faster cures, higher temperatures are required to release the curing catalyst. Accordingly, such epoxy systems are either undesirable on thermoplastic substrates, or are unsuitable for economic mass production procedures because of long cure times.

Although recent improvements have eliminated, in many instances, the need for time-consuming etching procedures for making circuit boards based on the direct application of conductive inks which can be cured in various ways, no curable conductive printing inks are available which can be rapidly cured within 2 minutes or less, and which can be used on a wide variety of substrates, including thermoplastic substrates.

As shown in Bolon et l copending application Ser. No. 509,822, filed Sept. 27, 1974 filed concurrently herewith and assigned to the same assignee as the present invention, certain radiation curable inks comprising a particulated electrically conductive metal containing material, such as silver coated glass spheres, and an organic resin binder, for example, a blend of a polyester having aliphatic unsaturation and styrene as a coreactant, can be cured within two minutes or less under ambient conditions to the conductive state.

A surprising feature of the radiation curable ink as discussed in the above mentioned copending application Ser. No. 509,822 filed Sept. 27, 1974, Bolon et al is that the shape of the particulated conductive material largely determines whether the radiation curable ink will cure satisfactorily to the conductive state. For example unsatisfactory cures result, if the particulated electrically conductive metal containing material is in the form of flakes. Flakes are defined within the meaning of the present invention as being an electrically conductive metal containing material which have an aspect ratio D/T of greater than 20, where "D" is the diameter of the flake and T is the thickness. Experience has shown that the particulated electrically conductive metal containing material employed in the practice of the invention is preferably spherical, spheroidal or oblong spheroidal in shape. Although less desirable than spheres, metal fibers, or glass fibers coated with metal have been found to be more effective than metal flakes, with respect to allowing satisfactory cures of the photoconductive ink when it is subjected to radiation cure. It has been found however, that up to about 15% by weight of flakes based on the weight of particulated electrically conductive metal containing material can be tolerated in the ink without adverse results.

Although valuable results are achieved with the radiation curable ink of Ser. No. 509,822, filed Sept. 27, 1974, such as the ability to make circuit boards in an improved manner, as shown in copending application Ser. No. 509,893, filed Sept. 27, 1974 of Bolon et al, filed concurrently herewith and assigned to the same assignee as the present invention, it is found that the radiation curable inks often have to be agitated prior to use. The particulated metal containing filler material has a tendency to settle and separate from the organic resin binder forming two distinct layers. In particular instances, the filler can cake after extended shelf periods. Extensive mechanical working of the radiation curable ink can be required prior to its application onto a substrate in a suitable manner.

The present invention is based on the discovery that if at least 0.5% by weight of certain non-ionic surfactants based on the weight of the organic resin binder are employed in the above-described radiation curable ink that the tendency of the particulated electrically conductive metal containing filler to settle is substantially reduced. More surprisingly, however, it has also been found that the conductivity of the resulting cured printing ink is also substantially enhanced.

There is provided by the present invention a radiation curable ink comprising by volume.

A. 10% to 60% of an organic resin binder, and
B. 90% to 40% of a particulated electrically conductive metal-containing material substantially free of metal-containing material having an aspect ratio of diameter-to-thickness of a value greater than 20, where (A) is a radiation curable organic resin having from 0.5% to 10% and preferably from 1 to 5% by weight of a non-ionic organic surfactant.

Included by the non-ionic surfactants which can be used in the radiation curable inks of the present invention are, for example, polyoxyethylenes, ethoxylated alkylphenols, ethoxylated aliphatic alcohols, carboxylic esters, carboxylic amides, polyoxyethylene fatty acid amides, polyalkyleneoxide block copolymers, etc. Additional examples are shown on pages 531–554, Kirk-Othmer *Encyclopedia of Chemical Technology*, 2nd Edition, Vol. 19, Interscience Publishers, John Wiley & Sons, Inc., New York.

Included by the particulated electrically conductive metal containing materials which can be used in the practice of the invention are preferably silver-coated glass spheres, or spheroids, sometimes referred to as "beads", which have a diameter of about 6 to 125 microns and preferable 10 to 50 microns. These materials are commercially available and are made from glass spheres commonly employed as reflective filler materials. Also included are particulated metals such as iron, zinc, nickel, copper, etc., which have average diameters as previously defined and are substantially free of a non-conductive oxide coating. Procedures for making such conductive particles by plating with silver, or initially priming with copper followed by plating with silver, or noble metals, are shown by Ehrreich U.S. Pat. No. 3,202,483. Glass fibers coated with silver, copper or nickel as shown, for example, in French Patent 1,531,272 also can be used.

Particulated metals such as iron, nickel, copper, zinc, etc. in the forming of spheres, spheroids or oblong spheroids, metal or fibers also can be used which have been reduced in a hydrogen or other reducing atmosphere at elevated temperatures to effect the substantial removal of non-conductive oxide coating sufficient to render the metal particles conductive. The particulated metal in reduced form can be shielded from oxygen prior to being treated with the organic resin binder. The resulting radiation curable ink can be stored under sealed conditions prior to use.

Some of the organic resin binders which can be used in making the radiation curable inks of the present invention in combination with the above-described conductive particulated materials are in the form of either low molecular weight aliphatically unsaturated organic polymers, or a mixture of an aliphatically unsaturated organic polymer in further combination with a copolymerizable aliphatically unsaturated organic monomer such as styrene. The aforementioned solventless aliphatically unsaturated organic resin materials can have a viscosity of from about 50 to 10,000 centipoises at 25° C.

One variety of the solventless resins which can be employed in combination with the particulated electrically conductive metal containing materials as described above in the production of the radiation curable ink of the present invention are low molecular weight polyimides containing acrylamide unsaturation, such as shown in U.S. Pat. No. 3,535,148 - Ravve. These materials can be colorless liquids having relatively low viscosity. Another example is low molecular weight polyesters containing acrylic unsaturation shown by U.S. Pat. No. 3,567,494 - Setko. Additional examples of solventless resins are acrylate esters, or methacrylic esters of polyhydric alcohols, such as shown by U.S. Pat. Nos. 3,551,246 and 3,551,235 - Bassemir. Further examples are shown by Nass U.S. Pat. No. 3,551,311. In addition, there also is included acrylate or methacrylate esters of silicone resins, acrylate or methacrylate esters, melamine, epoxy resins, allyl esters of polyhydric alcohols, allyl esters of polyfunctional aliphatic or aromatic acids, low molecular weight maleimido substituted aromatic compounds, cinnamic esters of polyfunctional alcohols, or mixtures of such compounds, etc.

The organic resin binder which can be used in combination with the above-described particulated electrically conductive metal containing materials can be further defined as unsaturated polymers, for example, a polyester from a glycol and $\alpha,\beta$-unsaturated dicarboxylic acids, such as maleic and fumaric acids, with or without other dicarboxylic acids free of $\alpha,\beta$-unsaturation, such as phthalic, isophthalic, succinic, etc., dissolved in a copolymerizable aliphatically unsaturated organic solvent, such as styrene, vinyl toluene, divinyl benzene, methyl methacrylate, etc., or mixtures of such materials. Examples of such solventless resin compositions are shown by U.S. Pat. Nos. 2,673,151 and 3,326,710 - Brody; a further example is shown by South African Patent 694,724. Also included are unsaturated organosiloxanes having from 5 to 18 silicon atoms, which can be employed in combination with a vinylic organic monomer.

In instances where it is desired to make a radiation curable ink which is curable under ultraviolet radiation, UV sensitizers can be employed when the organic resin binder is in the form of a polyester or polyacrylate or other polymerizable UV curable material. There can be employed from about 0.5 to 5% by weight of the UV sensitizer based on the weight of resin. Included among the ultraviolet radiation photosensitizers which can be used are, for example, ketones such as benzophenone, acetophenone, benzil, benzyl methyl ketone; benzoins and substituted benzoines such as benzoin methyl ether, $\alpha$-hydroxymethyl benzoin isopropyl ether; sulfur compounds such as thiourea, aromatic disulfides, and other photosensitizers such as azides, thioketones, or mixtures thereof. There also can be used in the ink, UV stabilizers and antioxidants such as hydroquinone, tert-butyl-hydroquinone, tert-butyl-catechol, p-benzoquinone, 2,5-diphenyl-benzoquinone, 2,6-di-tert-butyl-p-cresol, benzotriazoles such as Tinuvin P (manufactured by Geigy Corp.), hydroxybenzophenones such as 2,4-hydroxybenzophenone, 2-hydroxy-4-methoxy-bezopheone, 4-dodecyl-2-hydroxbenzophenone, substituted acrylonitriles such as ethyl-2-cyano-3,3-diphenyl acrylate, 2-ethylhexyl-2-cyano-3,3-diphenyl acrylate, etc.

In addition, as shown by Gebhartt et al, Farbe und Lack 64 303(A58), small amounts of a paraffin wax, up to 2% by weight, such as a 135° F. MP can be incorporated into resins which contain polymerizable groups subject to oxygen inhibition. Such wax substantially reduces such oxygen inhibition which manifests itself as surface tack. Alternatively the wax may be omitted when radiation cures are to be conducted in an inert atmosphere. It also has been found that the conductivity of the cured ink can be impaired if chloride containing components are used which introduce more than 100 parts of chloride, per million of organic resin binder.

Additional examples of the organic resin binder which can be used in the practice of the invention are radiation curable epoxy compositions shown in copending applications of James Crivello, Ser. Nos. 466,374, 466,375, and 466,478, filed May 2, 1974, assigned to the same assignee as the present invention. These Crivello compositions are one-package radiation curable epoxy resins containing aromatic onium salts of the Group VIA elements, such as sulfur, aromatic halonium salts, and Group VA elements such as arsenic which break down under the influence of radiant energy to release a Friedel-Crafts catalyst such as boron trifluoride to effect the cure of the epoxy resin.

The epoxy resins which also can be utilized as the organic resin binder to produce the photocurable inks of the present invention includes any monomeric, dimeric or oligomeric or polymeric epoxy material containing one or a plurality of epoxy functional groups. For example, epoxy resins such as the bis epoxide adduct of low molecular weight polyethylene oxide, epoxidized soybean oil, epoxidized polybutadiene or other similar resins can be used alone or in combination with an epoxy containing compound as a reactive diluent. Such diluents as 4-vinylcyclohexene dioxide, limonene dioxide, 1,2-cyclohexene oxide, styrene oxide, etc., may be added as viscosity modifying agents.

In the practice of the invention, the radiation curable ink can be made by simply blending the particulated electrically conductive metal containing material, which may be referred to hereinafter as the "conductive filler," with a mixture of the organic resin binder, which hereinafter may be referred to as the "resin," and the non-ionic surfactant which hereinafter can be called the "surfactant."

Depending upon such factors as the viscosity of the resin or the surfactant, and the particle size and nature of the conductive filler, the resulting radiation curable ink can vary widely and can be a free-flowing fluid or a paste. In instances where it is desired to make a UV curable ink, a photosensitizer can be incorporated into the resin prior to blending with the conductive filler. There can be employed on a weight basis from about 0.5 part to 10 parts of filler per part of resin.

Blending can be achieved by simply stirring the ingredients in a suitable container. In particular situations, the surfactant can be a solid which can be dissolved into the resin. In instances where the conductive filler is in the form of particulated metal which has been freshly subjected to hydrogen reduction at temperatures of 300° to 800° C. to effect removal of non-conductive oxide coating, or a chemical treatment involving the use of ammonium persulfate solution, a special blending technique is preferably employed. The resin can be treated with a dry inert gas, such as passing the gas under the resin surface along with agitation to remove any oxygen, or moisture therefrom. Blending with the freshly-reduced filler is also achieved under sealed conditions such as a dry box. The resulting radiation curable ink can be used in a standard manner to produce desirable conductive coatings, if radiated with either ultraviolet light or election beam within a reasonable time after being applied to a substrate such as up to 10 minutes.

In order that those skilled in the art will be better able to practice the invention, the following examples are given by way of illustration, and not by way of limitation. All parts are by weight unless otherwise indicated.

EXAMPLE I

A polyester prepolymer was prepared by effecting reaction between about 35.3 parts of fumaric acid, 11.9 parts of dicyclopentadiene and 25.3 parts of propylene glycol. The resulting prepolymer was blended with about 24.4 parts of styrene, 1.8 parts of benzoin-sec-butylether and 0.7 part of a paraffin wax having a melting point of 135° F.

Another organic resin binder was prepared by dissolving in the same ingredients of the above-described organic resin binder, 5% by weight of a non-ionic surfactant in the form of a polyalkylene oxide block copolymer.

Photocurable ink "A" was prepared by blending 33 parts of the organic resin binder free of surfactant with 67 parts of silver-coated glass spheres having an average diameter of about 10–50 microns. On a volume basis, there was employed about 2 volumes of conductive filler per volume of resin. Another photocurable ink B was prepared following the same procedure using the organic resin binder containing the non-ionic surfactant.

The above photocurable inks were printed onto 2 inches × 6 inches polystyrene substrates in accordance with the procedure shown in our copending application Ser. No. 509,893, filed concurrently herewith and assigned to the same assignee as the present invention. The treated polystyrene substrates were then placed at a distance of about 8 inches from the arc tube of a General Electric H3T7 lamp which had been ballasted to permit operation at about 960 watts input. There was employed two quartz filters below the lamp having dimensions of about 5 inches × 10 inches. The filters were supported on steel supports which formed a channel through which air was blown. The upper filter support was in contact with a 6 foot copper coil having an average diameter of about ⅜ inches through which water was passed at about 25° C. The full intensity of the lamps was measured at about 20,000 $\mu\omega/cm^2$ and the temperature of the substrate did not exceed about 50° C. After 2 minutes cure, the panels were tested for continuity. The cured strips were about 3 mils by 40 mils by 5 inches. It was found that the strip made from the conductive cured ink derived from the radiation curable ink A had a specific resistivity of 0.015 ohm-cm. However, the radiation cured strip derived from the non-ionic surfactant containing ink B had a specific resistivity of 0.006 ohm-cm.

Radiation curable inks A and B were stirred vigorously and then allowed to rest for 48 hours. Ink B containing the surfactant remained substantially uniform after 48 hours. However, the ink A free of surfactant appeared to be in two phases after 24 hours on the shelf.

Both cured polystyrene panels were then subjected to an atmosphere of 96% humidity at a temperature of 120° F for two weeks. The panels were then tested again and it was found that the resistance of the cured ink did not substantially change.

EXAMPLE II

A photocurable ink C was prepared by blending together about 2 parts of the silver-coated glass beads of Example I with one part of an organic resin binder consisting of 70 parts of the acrylated epoxidized soybean oil and 20 parts of ethylhexyl acrylate with 2 parts of the photosensitizer of Example I. Prior to mixing, the volume of the glass-coated silver beads was approximately two times the volume of the organic resin binder.

Another photocurable ink D was prepared with the same ingredients containing 0.1% of a polyoxyethylene--polyoxpropylene block copolymer. The non-ionic surfactant was added to the organic resin binder prior to the incorporation of the filler.

The photocurable inks B and C were applied onto polystyrene substrates in accordance with the procedure of Example I and thereafter cured under ultraviolet light. The specific resistivity of the cured conductive coating derived from ink C free of the non-ionic surfactant was found to be 0.015 ohms-cm. The cured conductive coating obtained from ink D containing the surfactant gave a specific resistivity of 0.010 ohm-cm. In addition to providing superior conductive coating, curable ink D also was found to be substantially more stable than C after a week's shelf storage. The cured coating was subjected to the tropical humidity test described in Example I, and the specific resistivity of the circuit board does not substantially change.

Additional inks were prepared from the same formulation, except that in place of the non-ionic surfactant, there was incorporated an equal weight of cationic surfactants, such as Santomerse 3 of Monsanto Co. It was found that the curable ink remained tacky and did not cure satisfactorily.

EXAMPLE III

A photocurable ink was prepared by forming a blend of 2 parts of the silver-coated beads of Example I and one part of an epoxy resin binder. The epoxy resin binder consisted of about 15 parts of vinylcyclohexene dioxide and 85 parts of (3,4-epoxycyclohexyl)-methyl-3,-4-epoxycyclohexanecarboxylate. In addition, there was also utilized in the organic resin binder 2 parts of triphenylsulfoniumhexafluoro arsenate as a photosensitizer. Prior to mixing, it was found that the volume of the silver beads was approximately two times the volume of the binder resin.

The above-described photocurable ink was screened onto a polyethylene terephthalate, resin substrate in accordance with the procedures described in Example I. It was subjected to ultraviolet radiation and cured within 2 minutes. It was found to have a volume resistivity of about 0.05 ohms-cm. The resistance of the cured ink did not substantially change after it was subjected to the tropical humidity test of Example I.

EXAMPLE IV

The procedure of Example I is repeated except that in place of the silver-coated glass beads, there is employed highly reduced copper-coated glass beads. Hydrogen reduction is achieved by subjecting the copper-coated glass beads to a hydrogen atmosphere for about 30 minutes at a temperature of about 400° C.

Consistent with the results in Example I, the photocurable ink having about 2% by weight of non-ionic surfactant based on the weight of UV curable polyester, provided cured conductive strip exhibiting superior conductivity over cured strip derived from the same ink free of non-ionic surfactant.

EXAMPLE V

A photocurable ink is prepared by blending together about 5 parts of silver-coated copper beads having an average particle size of about 200 microns with one part of the polyester resin of Example I containing the same photosensitizer and 5% by weight of the same non-ionic surfactant. It is found that the volume of the silver-coated copper beads is about the same as the volume of the organic resin binder prior to blending.

The above-described radiation curable ink is applied onto a polystyrene substrate as described in Example I patterned in accordance with the attached drawing. It is found that after the applied ink is cured in accordance with the procedure of Example I, its specific resistivity is less than about 0.1 ohm-cm. The circuit board is then subjected to a tropical humidity test as described in Example I. It is found that the resistance of the photoconductive layer does not substantially change after a two-week test period.

EXAMPLE VI

A photocurable ink is prepared by blending together about 5 parts of chemically-treated copper powder having an average particle size of about 10 to 50 microns with one part of the polyester of Example I containing the same photosensitizer and the non-ionic surfactant. The copper powder is treated with a solution consisting of 240 g. of ammonium persulfate in 1000 parts of water, which is purged with nitrogen, to remove any oxide coating on the copper. After the chemically cleaned copper powder is thoroughly dried by agitating it in a dry nitrogen atmosphere, the copper powder is blended under nitrogen with the organic resin binder. It is found that about 5 parts of the copper powder is equivalent in volume to about one part of the polyester resin.

The photocurable ink is then applied onto a polystyrene substrate in accordance with the screening procedure of Example I. Upon cure of the ink within the 2 minutes using the same curing apparatus as described in Example I, the volume resistivity of the ink is found to be less than about 0.1 ohm-cm. The resulting circuit board satisfactorily passes the tropical humidity test described in Example I.

EXAMPLE VII

A radiation curable ink is made in accordance with the procedure of Example I, except that a curable liquid polyene-polythiol composition, as shown in Example II of Lard U.S. Pat. No. 3,728,240, is used in place of the polyester. There is also employed 2% by weight of non-ionic surfactant having a molecular weight of about 1000 and represented by the structure

where $a$, $b$, and $c$ are positive integers. There is employed 2 parts of silver-coated glass spheres per part of the liquid polyene-polythiol resin.

A circuit board made in accordance with the procedure of Example I, using the surfactant containing radiation ink is found to provide a circuit board exhibiting a superior specific resistivity over a circuit board made by the same procedure free of the non-ionic surfactant. Both circuit boards survive the humidity control test in a satisfactory manner.

Although the above examples are limited to only a few of the very many types of radiation curable ink which are embraced within the scope of the present invention, it should be understood that the radiation curable inks include a much broader class of organic resin binders, conductive particles, photosensitizers and non-ionic surfactants, which are previously described in the specification preceding these examples.

We claim:

1. A radiation curable screen printable ink comprising by volume
   A. 10% to 60% of a radiation curable organic resin binder, and
   B. 90% to 40% of electrically conductive silver or copper containing particles having up to about 15% by weight of metal particles with an aspect ratio of diameter-to-thickness of a value greater than 20, where (A) is a radiation curable organic resin having from 0.5% to 10% by weight of a non-ionic organic surfactant.

2. A radiation curable ink in accordance with claim 1, where the non-ionic organic surfactant is a polyalkylene oxide block copolymer.

3. A radiation curable ink in accordance with claim 1, where the non-ionic organic surfactant is an ethylene oxide--propylene oxide block copolymer.

4. A radiation curable screen printable ink in accordance with claim 1, where the silver or copper containing metal particles are in the form of silver-coated glass spheres.

5. A radiation curable screen printable ink in accordance with claim 1, where the silver or copper containing metal particles are in the form of silver-coated glass spheres.

6. A radiation curable screen printable ink in accordance with claim 1, where the silver or copper containing metal particles are in the form of chemically-reduced copper powder.

7. A radiation curable ink in accordance with claim 1, where the organic resin binder is in the form of a blend of a polyester prepolymer and styrene.

8. A radiation curable ink in accordance with claim 1, where the organic resin binder is in the form of a polyacrylate.

9. A radiation curable ink in accordance with claim 1, where the organic resin binder is in the form of a mixture of an epoxy resin and an aromatic onium salt selected from the class consisting of aromatic halonium salts, and aromatic onium salts of a Group VA element and an aromatic onium salt of a Group VIA element onium salt.

10. A radiation curable screen printable ink comprising by volume
   A. about 33% of a polyester reaction product of propylene glycol, fumaric acid and dicyclo pentadiene,
   B. from about 67% of silver-coated glass spheres having an average diameter of from about 10–50 microns, and
   C. from 0.5% to 5% by weight of (A) of a UV sensitizer, and
   D. from 1 to 5% based on the weight of (A) of a non-ionic organic surfactant.

* * * * *